(12) United States Patent
Dirscherl

(10) Patent No.: US 9,490,406 B2
(45) Date of Patent: Nov. 8, 2016

(54) OPTOELECTRONIC COMPONENT COMPRISING A TRANSPARENT COUPLING-OUT ELEMENT

(71) Applicant: OSRAM Opto Semiconductors GmbH, Regensburg (DE)

(72) Inventor: Georg Dirscherl, Tegernheim (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 14/430,191

(22) PCT Filed: Sep. 20, 2013

(86) PCT No.: PCT/EP2013/069608
§ 371 (c)(1),
(2) Date: Mar. 20, 2015

(87) PCT Pub. No.: WO2014/044813
PCT Pub. Date: Mar. 27, 2014

(65) Prior Publication Data
US 2015/0214447 A1    Jul. 30, 2015

(30) Foreign Application Priority Data
Sep. 21, 2012  (DE) ........................ 10 2012 108 939

(51) Int. Cl.
*H01L 23/29* (2006.01)
*H01L 33/50* (2010.01)
(Continued)

(52) U.S. Cl.
CPC ............. *H01L 33/56* (2013.01); *H01L 23/293* (2013.01); *H01L 33/486* (2013.01);
(Continued)

(58) Field of Classification Search
CPC ................ H01L 33/505; H01L 33/58; H01L 2224/48091; H01L 33/486; H01L 33/507; H01L 33/54; H01L 2924/00014; H01L 21/312; H01L 23/145; H01L 23/293; H01L 23/295; H01L 2031/0344; H01L 51/00; H01L 51/052; H01L 31/054; H01L 51/0035
See application file for complete search history.

(56) References Cited

U.S. PATENT DOCUMENTS 5,003,024 A * 3/1991 Panster .................... B01J 20/22
                                                  528/30
5,019,637 A * 5/1991 Panster .................... B01J 20/22
                                                  528/10
(Continued)

FOREIGN PATENT DOCUMENTS

DE          3837415 A1      5/1990
DE          3925358 A1      2/1991
(Continued)

OTHER PUBLICATIONS

14430191 Search Results, NPL.*
(Continued)

*Primary Examiner* — Galina Yushina
(74) *Attorney, Agent, or Firm* — McDermott Will & Emery LLP

(57) ABSTRACT

What is specified is an optoelectronic component comprising a layer sequence having an active layer, which emits primary electromagnetic radiation, and at least one transparent coupling-out element arranged in the beam path of the primary electromagnetic radiation. The at least one transparent coupling-out element comprises a hybrid material or is produced from a hybrid material.

17 Claims, 1 Drawing Sheet

(51) Int. Cl.
*H01L 33/56* (2010.01)
*H01L 33/58* (2010.01)
*H01L 33/48* (2010.01)
*H01L 33/54* (2010.01)
*H01L 21/312* (2006.01)

(52) U.S. Cl.
CPC .......... *H01L 33/501* (2013.01); *H01L 33/507* (2013.01); *H01L 33/54* (2013.01); *H01L 33/58* (2013.01); *H01L 21/312* (2013.01); *H01L 33/505* (2013.01); *H01L 2224/48091* (2013.01); *H01L 2924/12044* (2013.01)

(56) References Cited

U.S. PATENT DOCUMENTS

| | | | | |
|---|---|---|---|---|
| 5,061,773 | A | * | 10/1991 | Panster ............... B01J 20/26 528/12 |
| 5,484,869 | A | * | 1/1996 | Panster ............... B01J 20/22 528/18 |
| 7,126,162 | B2 | * | 10/2006 | Reeh ............... C09K 11/7718 257/100 |
| 2008/0191225 | A1 | * | 8/2008 | Medendorp ......... B29C 43/021 257/98 |
| 2008/0255354 | A1 | * | 10/2008 | Popp ................... C07F 7/1892 544/221 |
| 2012/0172544 | A1 | * | 7/2012 | Liang ................... C08L 83/04 525/478 |
| 2012/0329184 | A1 | * | 12/2012 | Petry ..................... H01L 33/56 438/27 |

FOREIGN PATENT DOCUMENTS

| | | |
|---|---|---|
| DE | 3925359 C1 | 2/1991 |
| EP | 1873211 A1 | 1/2008 |
| JP | S57202365 A | 12/1982 |
| JP | H02187430 A | 7/1990 |
| JP | H03149228 A | 6/1991 |
| JP | H03170532 A | 7/1991 |
| JP | H10316871 A | 12/1998 |
| JP | 2000063637 A | 2/2000 |
| JP | 2001348555 A | 12/2001 |
| JP | 4951147 B1 | 6/2012 |
| JP | 2012156334 A | 8/2012 |
| WO | 2009/148099 A1 | 12/2009 |
| WO | 2011/039078 A1 | 4/2011 |
| WO | 2012/067766 A2 | 5/2012 |

OTHER PUBLICATIONS

Vlasova, et al. N,N-Bis(trimethylsilylmethyl)thiocarbamide and N,N-Bis(trimethylsilylmethyl)—L6-thiocarbamide S, S-Dioxide, Russian Journal of General Chemistry, vol. 75, No. 6, 2005, pp. 860-861.*

Voronkov et al. N,N-Bis(triethoxysilylmethyl)thiocarbamide and Poly[N,N-bis(silsesquioxanylmethyl)thiocarbamide S,S-dioxide Russian Journal of General Chemistry, vol. 75, No. 7, 2005, pp. 1091-1093.*

STIC EIC 2800 Search Report for U.S. Appl. No. 14/430,191, Feb. 17, 2016.*

Gomes Correia, S.M. et al: "An Investigation of the Morphological, Electrical and Optoelectronic Properties of Short Chain Di-ureasils Doped with Er3+ Ions"; Ionics, vol. 8, 2002, pp. 73-78.

* cited by examiner

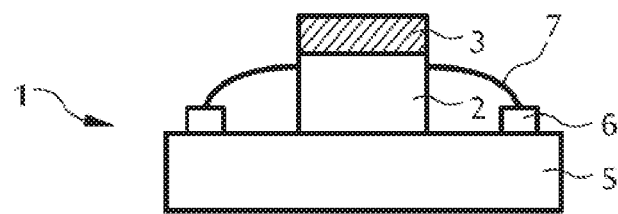
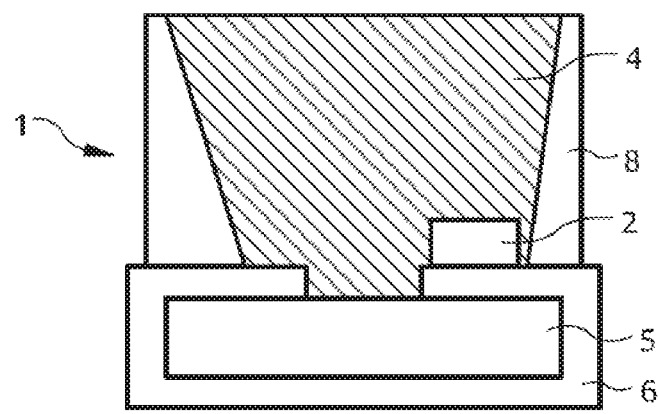
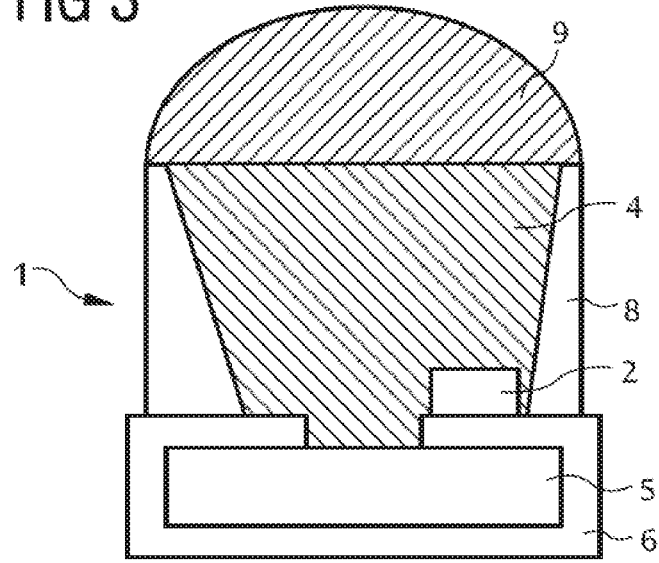

OPTOELECTRONIC COMPONENT COMPRISING A TRANSPARENT COUPLING-OUT ELEMENT

This patent application claims the priority of German patent application 10 2012 108 939.6, the disclosure content of which is hereby incorporated by reference.

Optoelectronic components, for example light-emitting diodes (LEDs) frequently have transparent coupling-out elements, for example a potting compound composed of polymeric materials. These polymeric materials frequently exhibit rapid aging caused by exposure to light and heat. The rapid aging of these materials and the associated loss of brightness restricts the lifetime of optoelectronic components. Especially in the case of LEDs in the high-power sector, i.e. LEDs having an electrical power exceeding one watt, only a very short lifetime of the LEDs can be achieved with conventional polymeric materials.

It is therefore an object of at least one embodiment of the present invention to provide an optoelectronic component having a transparent coupling-out element which features elevated stability to light and heat.

The object is achieved by an optoelectronic component having the features of claim 1.

Advantageous embodiments and developments of the present invention are specified in the dependent claims in each case.

An optoelectronic component is specified. The optoelectronic component comprises a layer sequence having an active layer which emits electromagnetic primary radiation and at least one transparent coupling-out element disposed in the beam path of the electromagnetic primary radiation. The at least one transparent coupling-out element comprises a hybrid material or has been produced from a hybrid material having the following structure:

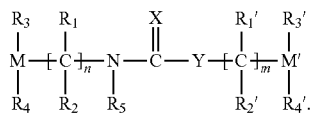

R1, R1', R2, R2' and R5 may be chosen identically or differently and are selected from a group comprising H, saturated and unsaturated alkyl radicals, fully or partly substituted, saturated and unsaturated alkyl radicals, aromatic systems, fully or partly substituted aromatic systems, heterocyclic systems and fully or partly substituted heterocyclic systems.

R3, R3', R4 and R4' may be chosen identically or differently and are selected from a group comprising H, saturated and unsaturated alkyl radicals, fully or partly substituted, saturated and unsaturated alkyl radicals, alkoxy groups, aryloxy groups, amines, amides, esters, aromatic systems, fully or partly substituted aromatic systems, heterocyclic systems and fully or partly substituted heterocyclic systems.

X is selected from a group comprising O, S and N—R6, where R6 is selected from the same group as R1, R1', R2, R2' and R5.

M and M' may be chosen identically or differently and are selected from a group comprising B, Al, Si—R7, Ge—R7' and Ti—R7". R7, R7' and R7" here may be chosen identically or differently and are selected from the same group as R3, R3', R4 and R4'.

Y is selected from a group comprising O, S, N—R5' and a bond, where R5' is selected from the same group as R1, R1', R2, R2' and R5, and R5' may be selected identically or differently to R1, R1', R2, R2' and R5.

The fact that Y may be a bond means that a compound of the following formula is present:

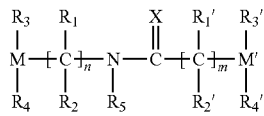

n, m may be chosen identically or differently, where and 1≤n, m≤10 000. Preferably, 1 n, m≤5000; more preferably, 1≤n, m≤1000.

If Y=N—R5', R1, R1', R2, R2', R5 and R5' may be chosen identically or differently and may be selected from a group comprising H, saturated and unsaturated alkyl radicals, fully or partly substituted, saturated and unsaturated alkyl radicals, aromatic systems, fully or partly substituted aromatic systems, heterocyclic systems and fully or partly substituted heterocyclic systems.

If Y=N—R5' and X=N—R6, R6 may be selected from the same group as R1, R1', R2, R2', R5 and R5'. Coupling-out elements which comprise a hybrid material or have been produced from a hybrid material have a high stability to heat and electromagnetic radiation. This high stability is attributable inter alia to the high bond stability of the structural unit

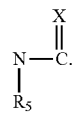

The bond energies of a C=S, C=N and C=O double bond are 587 kJ/mol, 616 kJ/mol and 708 kJ/mol, and the bond energy of the CN bond, because of its double bond character, is between 616 kJ/mol (CN double bond) and 305 kJ/mol (CN single bond). Furthermore, such coupling-out elements have very good adhesion to plastics and metals. Moreover, such coupling-out elements are notable for a very good abrasion resistance. Abrasion resistance is the resistance of the surface of the coupling-out element to mechanical stress, for example friction. Thus, premature failure of the optoelectronic component can be prevented and the lifetime of the optoelectronic component can be extended.

In one embodiment, the at least one transparent coupling-out element comprises a hybrid material having the following structure:

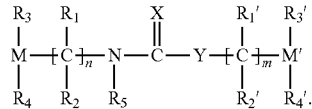

R1, R1', R2, R2' and R5 may be chosen identically or differently and are selected from a group comprising H, saturated, fully or partly substituted, saturated alkyl radicals, aromatic systems, fully or partly substituted aromatic systems, heterocyclic systems and fully or partly substituted heterocyclic systems.

R3, R3', R4 and R4' may be chosen identically or differently and are selected from a group comprising H, saturated alkyl radicals, fully or partly substituted, saturated alkyl radicals, alkoxy groups, aryloxy groups, amines, amides, esters, aromatic systems, fully or partly substituted aromatic systems, heterocyclic systems and fully or partly substituted heterocyclic systems.

In example aspects, the hybrid material has the following formula:

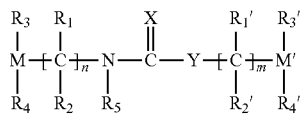

If in this formula, e.g., Y=N—R5', R5'=H, n=3, R1, R1', R2, R2'=H, M'=M=Si—R7, R7=R3=R4=R3'=R4'=ethoxy group (which is an alkoxy group) the compound bis(triethoxysiliyl)propylurea results, having the following structural formula:

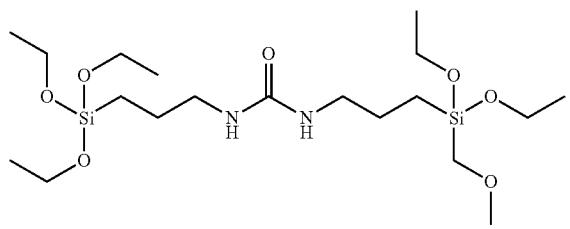

This compound is commercially available under the CAS number 69465-84-5. Further, under CAS number 23843-64-3 bis(trimethoxysiliyl)propylurea the hybrid material is commercially available. One is able to synthesize the hybrid material, e.g., by a nucleophilic addition of an amine to an isocyanate which gives a urea compound:

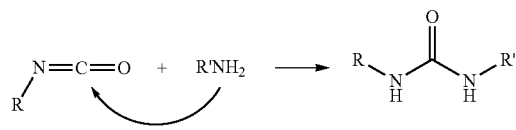

As some of the materials are commercially available, one is able to synthesize the hybrid material, e.g., by a well-known nucleophilic addition.

In one embodiment, the at least one transparent coupling-out element comprises a hybrid material or has been produced from a hybrid material having the following structure:

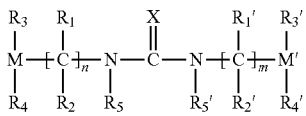

Coupling-out elements comprising such a hybrid material or produced from such a hybrid material have a very high stability to heat and electromagnetic radiation. This high stability is attributable inter alia to the very high bond stability of the structural unit

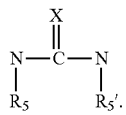

The hybrid materials can be obtained by simple condensation reactions and/or polyadditions, generally with high yields. It is therefore possible to produce coupling-out elements comprising a hybrid material or produced from a hybrid material in a very simple and also inexpensive manner.

"Transparent" in the present context is understood to mean that the particular article is virtually completely transparent to the entire visible electromagnetic spectrum, to electromagnetic radiation in the UV range and in the infrared range, or a partial spectrum thereof. The primary radiation emitted by the layer sequence may, for example, be in the visible range or in the UV range of the electromagnetic spectrum.

In one embodiment, the coupling-out element has a transparency exceeding 95%; more preferably, the transparency of the coupling-out element exceeds 98% for the primary radiation emitted.

"Layer sequence" in this context is understood to mean a layer sequence comprising more than one layer, for example a sequence comprising at least one p-doped and one n-doped semiconductor layer, the layers being arranged one on top of another.

The layer sequence may take the form of an epitaxial layer sequence or a radiation-emitting semiconductor chip having an epitaxial layer sequence, i.e. an epitaxially grown semiconductor layer sequence. In this case, the layer sequence may be based, for example, on InGaAlN. InGaAlN-based semiconductor chips and semiconductor layer sequences are especially those in which the epitaxially produced semiconductor layer sequence has a layer sequence composed of different individual layers, which contains at least one individual layer including a material formed from the III-V compound semiconductor material system $In_xAl_yGa_{1-x-y}N$ with $0 \leq x \leq 1$, $0 \leq y \leq 1$ and $x+y \leq 1$. Semiconductor layer sequences having at least one active layer based on InGaAlN can emit, for example, electromagnetic radiation in an ultraviolet to green wavelength range.

Alternatively or additionally, the semiconductor layer sequence or the semiconductor chip may also be based on InGaAlP, meaning that the semiconductor layer sequence may have different individual layers, of which at least one individual layer includes a material formed from the III-V compound semiconductor material system $In_xAl_yGa_{1-x-y}P$ with $0 \leq x \leq 1$, $0 \leq y \leq 1$ and $x+y \leq 1$. Semiconductor layer sequences or semiconductor chips having at least one active layer based on InGaAlP can preferentially emit, for example, electromagnetic radiation having one or more spectral components within a green to red wavelength range.

Alternatively or additionally, the semiconductor layer sequence or the semiconductor chip may also include other III-V compound semiconductor material systems, for example an AlGaAs-based material, or II-VI compound semiconductor material systems. More particularly, an active layer including an AlGaAs-based material may be suitable for emitting electromagnetic radiation having one or more spectral components in a red to infrared wavelength range.

The active semiconductor layer sequence may, as well as the active layer, comprise further functional layers and functional regions, for instance p- or n-doped charge carrier transport layers, i.e. electron or hole transport layers, undoped or p- or n-doped confinement, cladding or waveguide layers, barrier layers, planarization layers, buffer layers, protective layers and/or electrodes, and combinations thereof. In addition, one or more mirror layers may be applied, for example, on a side of the semiconductor layer sequence facing away from the growth substrate. The structures described here in relation to the active layer or the further functional layers and regions are known to those skilled in the art, especially in terms of composition, function and structure, and will therefore not be elucidated any further at this point.

In one embodiment, the R6 radicals are selected from a group comprising H, saturated alkyl radicals, fully or partly substituted saturated alkyl radicals, aromatic systems and fully or partly substituted aromatic systems. For example, R6 may be methyl, ethyl, propyl, isopropyl, butyl, isobutyl, sec-butyl, tert-butyl, cyclohexyl or phenyl radicals. More preferably, R6 is H.

Preferably, R3, R3', R4, R4', R7, R7' and R7" are selected from a group comprising H, saturated alkyl radicals, fully or partly substituted, saturated alkyl radicals, alkoxy groups and aryloxy groups. Saturated alkyl radicals may, for example, be methyl, ethyl, propyl, isopropyl, butyl, isobutyl, sec-butyl, tert-butyl, cyclohexyl radicals. More preferably, R3, R3', R4, R4', R7, R7' and R7" are selected from a group comprising alkoxy groups and aryloxy groups.

In one embodiment, R3 and R3' and/or R4, R4' are chosen identically. If the coupling-out element comprises a hybrid material or the coupling-out element has been produced from a hybrid material including the R7, R7' and/or R7" radicals, R7, R7' and/or R7" may correspond to the R3 and R3' radicals and/or to the R4, R4' radicals, i.e. be chosen identically.

In one embodiment, the at least one transparent coupling-out element comprises a hybrid material or has been produced from a hybrid material having the following structure:

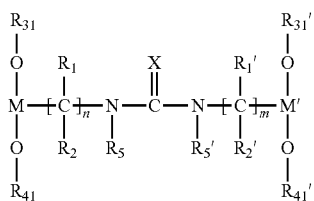

R31, R31', R41 and R41' here may be chosen identically or differently and are selected from a group comprising H, saturated and unsaturated alkyl radicals, fully or partly substituted, saturated and unsaturated alkyl radicals, aromatic systems, fully or partly substituted aromatic systems, fused aromatic systems, fully or partly substituted, fused aromatic systems, heterocyclic systems, fully or partly substituted heterocyclic systems, fused heterocyclic systems and fully or partly substituted, fused heterocyclic systems. Preferably, R31, R31', R41 and R41' are selected from a group comprising H, saturated alkyl radicals, fully or partly substituted, saturated alkyl radicals, aromatic systems, fully or partly substituted aromatic systems, heterocyclic systems and fully or partly substituted heterocyclic systems. More preferably, R31, R31', R41 and R41' are selected from a group comprising H, saturated alkyl radicals and fully or partly substituted, saturated alkyl radicals. Saturated alkyl radicals may, for example, be methyl, ethyl, propyl, isopropyl, butyl, isobutyl, sec-butyl, tert-butyl and cyclohexyl radicals.

M' is selected from a group comprising B, Al, Si—OR71, Ge—OR71' and Ti—OR71", where R71, R71' and R71" may be chosen identically or differently and are selected from the same group as R31, R31', R41 and R41'.

M is selected from a group comprising B, Al, Si—OR72, Ge—OR72' and Ti—OR72". R72, R72' and R72" here may be chosen identically or differently and are selected from the same group as R31, R31', R41 and R41'.

If the coupling-out element comprises a hybrid material or the coupling-out element has been produced from a hybrid material having the R71 and R72, R71' and R72' or R71" and R72" radicals, R71 and R72, R71' and R72' or R71" and R72" may be chosen identically.

In one embodiment, R31 and R41 and/or R31' and R41' are chosen identically. If the coupling-out element comprises a hybrid material or the coupling-out element has been produced from a hybrid material having the R71, R71' or R71" radicals, R71, R71' or R71" may correspond to the R31' and R41' radicals, i.e. be chosen identically. If the coupling-out element comprises a hybrid material or the coupling-out element has been produced from a hybrid material having the R72, R72' or R72" radicals, R72, R72' or R72" may correspond to the R31 and R41 radicals, i.e. be chosen identically.

In a preferred embodiment, X is selected from a group comprising O and S. In a particularly preferred embodiment, X=O.

An coupling-out element which comprises such a hybrid material or has been produced from such a hybrid material exhibits very high stability with respect to heat and radiation because of the high bond stability of the urea functionality. The bond energy of the C=O double bond is 708 kJ/mol. The high stability is manifested in that the coupling-out element neither yellows nor turns cloudy under the action of radiation in the visible, UV and infrared region of the electromagnetic spectrum and under the action of heat. The lifetime of the optoelectronic component is therefore not limited by the coupling-out element. Furthermore, such coupling-out elements display very good adhesion to plastics and metals. Moreover, it gives high elasticity and very good abrasion resistance.

In one embodiment, M and M' are selected from a group comprising Si—R7 and Al. More preferably, M and M' are each Si—R7.

In one embodiment, the at least one coupling-out element comprises a hybrid material or has been produced from a hybrid material having the following structure:

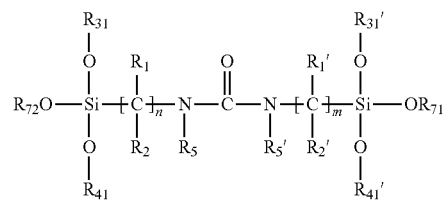

where R31, R31', R41, R41', R71 and R72 may be chosen identically or differently and are selected from a group comprising H, saturated alkyl radicals, fully or partly substituted, saturated alkyl radicals, aromatic systems, fully or partly substituted aromatic systems, heterocyclic systems and fully or partly substituted heterocyclic systems.

In one embodiment, R1, R1', R2, R2' are selected from a group comprising H, saturated alkyl radicals, fully or partly substituted saturated alkyl radicals, aromatic systems and fully or partly substituted aromatic systems. For example, R1, R1', R2, R2' may be methyl, ethyl, propyl, isopropyl, butyl, isobutyl, sec-butyl, tert-butyl, cyclohexyl or phenyl radicals. More preferably, R1, R1', R2, R2' are each H.

The R1 and R1' and/or R2 and R2' radicals may be chosen identically. It is also possible that the radicals and R1 and R2 and/or R1' and R2' are chosen identically.

In one embodiment, R5 and R5' are selected from a group comprising H, saturated alkyl radicals and fully or partly substituted saturated alkyl radicals. For example, R5 and R5' may be methyl, ethyl, propyl, isopropyl, butyl, isobutyl, sec-butyl, tert-butyl, cyclohexyl or phenyl radicals. R5 and R5' may be chosen identically or differently. More preferably, R5 and R5' are each H.

The optoelectronic component may be a luminescent diode, a photodiode/transistor array module and an optical coupler. Alternatively, the optoelectronic component is an organic light-emitting diode (OLED). More particularly, the optoelectronic component may be an LED having an electrical power of one watt or more.

In one embodiment, the at least one transparent coupling-out element comprises converter particles. The converter particles are distributed in the coupling-out element and at least partly convert the electromagnetic primary radiation to an electromagnetic secondary radiation.

"At least partly" means that the electromagnetic primary radiation is at least partly absorbed by the converter particles and emitted as electromagnetic secondary radiation having a wavelength range different than the electromagnetic primary radiation. The electromagnetic primary radiation and/or electromagnetic secondary radiation may comprise one or more wavelengths and/or wavelength ranges in an infrared to ultraviolet wavelength range, especially in a visible wavelength range. In this case, the spectra of the primary radiation and/or the secondary radiation may be narrow-band, meaning that the primary radiation and/or the secondary radiation in that case have a monochrome or virtually monochrome wavelength range. The spectrum of the primary radiation and/or the spectrum of the secondary radiation may alternatively also be broad-band, meaning that the primary radiation and/or the secondary radiation may have a wavelength range of mixed color, in which case the wavelength range of mixed color may have a continuous spectrum or a plurality of discrete spectral components having different wavelengths.

The primary radiation and the secondary radiation, superimposed on one another, may give a white light impression. For this purpose, the primary radiation may preferably give a blue light impression and the secondary radiation a yellow light impression, which can arise through spectral components of the secondary radiation in the green wavelength range and/or spectral components in the green and red wavelength ranges.

It is also possible that the electromagnetic primary radiation is converted completely or virtually completely to an electromagnetic secondary radiation. The electromagnetic primary radiation is absorbed here completely or virtually completely by the converter material and emitted in the form of an electromagnetic secondary radiation. The radiation emitted from the optoelectronic component in this embodiment therefore corresponds completely or virtually completely to the electromagnetic secondary radiation. Virtually complete conversion is understood to mean a conversion exceeding 90%, especially exceeding 95%.

It is possible that the primary radiation is within the UV range and the secondary radiation gives a blue and yellow light impression, which can arise through spectral components of the secondary radiation in the blue and yellow wavelength ranges and/or spectral components in the blue, green and red wavelength ranges. The secondary radiation here can give a white light impression.

In one embodiment, the electromagnetic secondary radiation is in a blue to infrared wavelength range.

In one embodiment, the coupling-out element has a transparency exceeding 95% for the emitted secondary radiation; more preferably, the transparency of the coupling-out element exceeds 98% for the emitted secondary radiation.

In one embodiment of the optoelectronic component, the converter particles have a particle diameter of 1 to 20 µm. Preferably, the converter particles have a particle diameter of 5 to 15 µm, more preferably of 10 µm.

The converter particles may be formed, for example, from one of the following luminophores: garnets doped with rare earth metals, alkaline earth metal sulfides doped with rare earth metals, thiogallates doped with rare earth metals, aluminates doped with rare earth metals, silicates, such as orthosilicates, doped with rare earth metals, chlorosilicates doped with rare earth metals, alkaline earth metal siliconitrides doped with rare earth metals, oxynitrides doped with rare earth metals and aluminum oxynitrides doped with rare earth metals, siliconitrides doped with rare earth metals, sialons.

Luminophores used may especially be garnets, such as yttrium aluminum oxide (YAG), lutetium aluminum oxide (LuAG) and terbium aluminum oxide (TAG).

The luminophores are doped, for example, with one of the following activators: cerium, europium, terbium, praseodymium, samarium, manganese.

In a further embodiment, the coupling-out element comprises converter particles of various luminophores.

In one embodiment, the converter particles are present to an extent of 1% to 50% by volume in relation to the hybrid material. Preference is given to 10% to 40% by volume, particular preference to 20% to 30% by volume.

In one embodiment, the converter particles are distributed homogeneously in the coupling-out element. Homogeneous distribution of the converter particles enables homogeneous conversion of the primary radiation by the converter particles, which results in uniform emission characteristics of the secondary radiation.

In one embodiment, the at least one coupling-out element has been produced from the hybrid material and the converter particles are bound to the hybrid material by chemical bonds. Chemical bonds may be understood to mean covalent bonds, ionic bonds or else coordinate bonds between the converter particles and the hybrid material.

In one embodiment, the at least one coupling-out element comprises nanoparticles.

In one embodiment, the nanoparticles are smaller than one tenth of the wavelength of the primary radiation emitted by the active layer of the layer sequence. The nanoparticles may have a size of 10 to 25 nm, 10 to 20 nm, more preferably 10 to 15 nm. In this order of magnitude, the nanoparticles do not scatter the primary radiation and/or secondary radiation.

In one embodiment, the nanoparticles comprise thermally conductive materials.

In one embodiment, the thermally conductive materials are selected from a group comprising $Al_2O_3$, AlN, $SiO_2$ and combinations thereof.

As a result of thermally conductive materials, no buildup of heat arises in the coupling-out element, and it is possible to guarantee a constant luminance and a constant color locus over the length of the service life of the optoelectronic component. It is thus possible to prevent premature failure of the optoelectronic component and to prolong the lifetime of the optoelectronic component.

In one embodiment, the nanoparticles comprise fillers having a refractive index $n_D$ at 23° C. of greater than or equal to 2.

Coupling-out elements including fillers having a refractive index $n_D$ at 23° C. of greater than or equal to 2 exhibit increased light emission, since light losses through reflection and total reflection can be substantially avoided. The emission of light is particularly high when the refractive index of the coupling-out element has a similar refractive index to the layers adjoining the coupling-out element within the beam path of the component.

The fillers may be selected from a group comprising $ZrO_2$, $TiO_2$, $Nb_2O_5$, $Ta_2O_5$ and combinations thereof. The filler is preferably $ZrO_2$.

The nanoparticles may be bound to the hybrid material through ionic interactions. Especially when M and/or M' is/are Si—R7, very strong binding of the nanoparticles to the hybrid material is possible through particularly strong ionic interactions of the silicon in the hybrid material with the nanoparticles, especially with $ZrO_2$.

It is possible that various nanoparticles are present in the coupling-out element. For example, a thermally conductive material and a filler having a refractive index $n_D$ at 23° C. of greater than or equal to 2 may be present.

In one embodiment, the nanoparticles are distributed homogeneously in the coupling-out element, which results in homogeneous emission characteristics of the secondary radiation and/or the primary radiation.

In one embodiment, the optoelectronic component comprises a housing. A recess may especially be present in the middle of the housing. The layer sequence may be disposed in the recess. It is possible that the recess containing the layer sequence is filled with a potting compound.

In one embodiment, the coupling-out element takes the form of a potting compound. The potting compound may fill the recess in the housing.

In one embodiment, the coupling-out element takes the form of a covering plate disposed above the layer sequence. It is possible that the covering plate covers the entire surface of the layer sequence.

The fact that a layer or an element is disposed or applied "atop" or "above" another layer or another element, here and hereinafter, may mean that one layer or one element is disposed immediately in direct mechanical and/or electrical contact atop the other layer or the other element. In addition, it may also mean that one layer or one element is indirectly disposed atop or above the other layer for the other element. In that case, further layers and/or elements or a clear gap may be disposed between one or the other layer or between one or the other element.

In a further embodiment, the coupling-out element is a lens. It is possible that the lens is disposed above a potting compound. Direct mechanical contact is possible between the lens and the potting compound.

In a further embodiment, the optoelectronic component comprises two coupling-out elements.

The first coupling-out element here may be a potting compound which comprises the hybrid material or has been produced from the hybrid material. The second coupling-out element may be a covering plate disposed above the layer sequence, which comprises the hybrid material or has been produced from the hybrid material.

It is also possible that the second coupling-out element is a lens which has been produced from the hybrid material or comprises the hybrid material.

Another possibility is that the first coupling-out element is a covering plate arranged above the layer sequence, which has been produced from the hybrid material or comprises the hybrid material.

The first and second coupling-out elements may comprise the same hybrid materials or have been produced from the same hybrid material.

Preferably, the first and second coupling-out elements comprise different hybrid materials or have been produced from different hybrid materials.

It is possible that the first and second coupling-out elements comprise identical or different converter particles.

In a further embodiment, the optoelectronic component comprises at least one second layer sequence.

It is possible that coupling-out elements in the form of a covering plate are applied above the second and every further layer sequence.

In one embodiment, the covering plate has a thickness of 10 μm to 100 μm, preferably 20 μm to 50 μm, more preferably 30 μm to 40 μm.

It is possible that a potting compound is disposed above the covering plate. The potting compound may be selected from conventional potting materials.

In one embodiment, an adhesion layer is disposed between the layer sequence and the covering plate.

It is possible that an adhesion layer is disposed between the potting compound and the lens.

Typically, however, no adhesion layers are needed since the covering plates, lenses and potting compounds comprising the hybrid material, or the covering plates, lenses and potting compounds which have been produced from the hybrid material, have very good bond strength to the adjacent layers or elements. More particularly, the bond strength to adjacent layers or elements is very high when they comprise plastics or metals.

The fact that a layer or an element is disposed between two other layers or elements, here and hereinafter, may mean that one layer or one element is disposed immediately in direct mechanical and/or electrical contact or in indirect contact with one of the two other layers or elements and in direct mechanical and/or electrical contact or in indirect contact with others among the two other layers or elements. In that case, when there is indirect contact, further layers and/or elements or a clear gap may be disposed between one and at least one of the two other layers or between one and at least one of the two other elements.

In one embodiment, the housing has been produced from a hybrid material having the following structure:

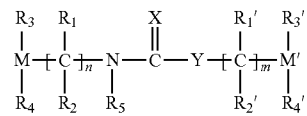

R1, R1', R2, R2' and R5 may be chosen identically or differently and are selected from a group comprising H, saturated and unsaturated alkyl radicals, fully or partly substituted, saturated and unsaturated alkyl radicals, aromatic systems, fully or partly substituted aromatic systems, heterocyclic systems and fully or partly substituted heterocyclic systems.

R3, R3', R4 and R4' may be chosen identically or differently and are selected from a group comprising H, saturated and unsaturated alkyl radicals, fully or partly substituted, saturated and unsaturated alkyl radicals, alkoxy groups, aryloxy groups, amines, amides, esters, aromatic systems, fully or partly substituted aromatic systems, heterocyclic systems and fully or partly substituted heterocyclic systems.

X is selected from a group comprising O, S and N—R6, where R6 is selected from the same group as R1, R1', R2, R2' and R5.

M and M' may be chosen identically or differently and are selected from a group comprising B, Al, Si—R7, Ge—R7' and Ti—R7''. R7, R7' and R7'' here may be chosen identically or differently and are selected from the same group as R3, R3', R4 and R4'.

Y is selected from a group comprising O, S, N—R5' and a bond, where R5' is selected from the same group as R1, R1', R2, R2' and R5, and may be selected identically or differently to R1, R1', R2, R2'.

The fact that Y may be a bond means that a compound of the following formula is present:

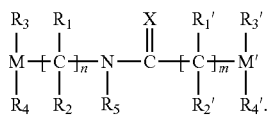

n, m may be chosen identically or differently, where and 1≤n, m≤10 000. Preferably, 1≤n, m≤5000; more preferably, 1≤n, m≤1000.

In one embodiment, the housing has been produced from a hybrid material having the following structure:

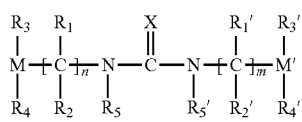

where
R1, R1', R2, R2', R5 and R5' may be chosen identically or differently and are selected from a group comprising H, saturated and unsaturated alkyl radicals, fully or partly substituted, saturated and unsaturated alkyl radicals, aromatic systems, fully or partly substituted aromatic systems, heterocyclic systems and fully or partly substituted heterocyclic systems, R3, R3', R4 and R4' may be chosen identically or differently and are selected from a group comprising H, saturated and unsaturated alkyl radicals, fully or partly substituted, saturated and unsaturated alkyl radicals, alkoxy groups, aryloxy groups, amines, amides, esters, aromatic systems, fully or partly substituted aromatic systems, heterocyclic systems and fully or partly substituted heterocyclic systems, X is selected from a group comprising O, S and N—R6,
R6 is selected from the same group as R1, R1', R2, R2', R5 and R5', M and M' may be chosen identically or differently and are selected from a group comprising B, Al, Si—R7, Ge—R7' and Ti—R7'', R7, R7' and R7'' may be chosen identically or differently and are selected from the same group as R3, R3', R4 and R4', and n, m may be chosen identically or differently and 1≤n, m≤1000.

Preferably, the housing has been produced from a hybrid material having the following structure:

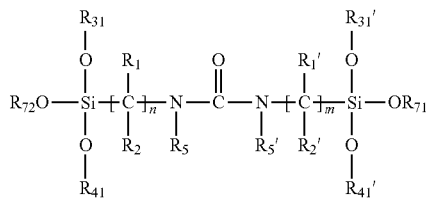

where R31, R31', R41, R41', R71 and R71' may be chosen identically or differently and are selected from a group comprising unsaturated alkyl radicals having terminal C=C double bonds and partly substituted unsaturated alkyl radicals having terminal C=C double bonds.

Alkyl radicals having terminal C=C double bonds are understood to mean that the alkyl radicals have a C=C double bond at a far chain end from the attachment to the oxygen, where one of the carbon atoms involved in the double bond is a $CH_2$ group or a carbon atom having two alkyl or aryl radicals.

Through the use of hybrid materials having unsaturated alkyl radicals having terminal C=C double bonds and partly substituted unsaturated alkyl radicals having terminal C=C double bonds, the hybrid materials can polymerize further. Thus, it is possible to increase the chemical and physical stability of the material, since a three-dimensional network arises, and so the material can also be used for a housing.

The housing has preferably been produced from a hybrid material where R31, R31', R41, R41', R71 and R71' have the following structure:

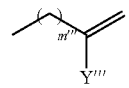

where m'''=0 to 6. Y''' is selected from a group comprising hydrogen, alkyl substituents and aryl substituents. Preferably, Y''' is H, methyl, ethyl, propyl, isopropyl, butyl, isobutyl, sec-butyl, tert-butyl, cyclohexyl or phenyl radicals.

In one embodiment, the housing has a reflective design at least in the region of the recess.

In one embodiment, the housing comprises white pigments. The white pigments are used to color the housing or regions of the housing. The coloring can, for example, increase the reflectivity and radiation resistance of the housing.

In one embodiment, the white pigments are selected from a group comprising titanium dioxide, lithopone, barium sulfate, zinc oxide, zinc sulfide, lead carbonate, calcium carbonate and combinations thereof.

Further advantageous embodiments and developments of the invention are apparent from the working examples described hereinafter and in conjunction with the figures.

FIGS. 1, 2 and 3 show schematic side views of various embodiments of optoelectronic components.

The optoelectronic component 1 according to FIG. 1 shows a carrier 5 with a conductor track 6. Disposed on the carrier 5 is a layer sequence 2 electrically connected to the conductor track 6 via bonding wires 7. Applied above the layer sequence 2 is an coupling-out element in the form of a covering plate 3. The coupling-out element 3 comprises a hybrid material and converter particles, the converter particles being distributed homogeneously in the hybrid material. For example, the hybrid material has the following structure:

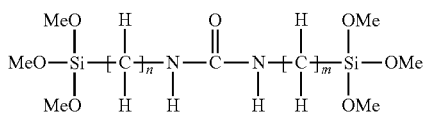

The covering plate 3 is disposed in the beam path of the electromagnetic primary radiation which is emitted by an active layer (not shown here) in the layer sequence 2.

Preferably, the optoelectronic component 1 is an LED, in which case the primary radiation is emitted upward through a transparent semiconductor layer sequence 2, and the primary radiation and the secondary radiation emitted by the converter particles are emitted via the coupling-out element 3, which is transparent.

The optoelectronic component according to FIG. 2 shows a carrier 5 with a conductor track 6 and a housing 8. The housing 8 has, in the middle, a recess in which there is disposed the layer sequence 2 which is electrically connected to the conductor track 6. The recess is filled with a potting compound 4. The potting compound 4 has been produced from a hybrid material or comprises a hybrid material having the following structure:

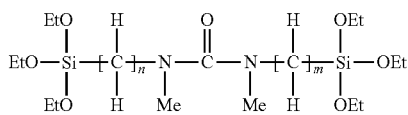

The potting compound 4 is disposed in the beam path of the electromagnetic primary radiation, which is emitted by an active layer (not shown here) in the layer sequence 2. The potting compound 4 further comprises converter particles which convert the primary radiation at least partly to a secondary radiation.

Preferably, the optoelectronic component 1 is an LED, in which case the primary radiation is emitted upward through a transparent semiconductor layer sequence 2 and a transparent potting compound 4. The secondary radiation is also emitted through the transparent potting compound 4.

The optoelectronic component according to FIG. 3 shows a carrier 5 with a conductor track 6 and a housing 8. The housing 8 has, in the middle, a recess in which there is disposed the layer sequence 2 which is electrically connected to the conductor track 6. The recess is filled with a potting compound 4. The potting compound 4 has been produced from a hybrid material or comprises a hybrid material having the following structure:

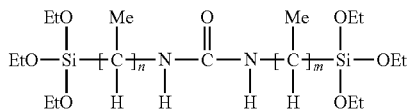

The potting compound 4 is disposed in the beam path of the electromagnetic primary radiation, which is emitted by an active layer (not shown here) in the layer sequence 2. The potting compound further comprises converter particles which convert the primary radiation at least partly to a secondary radiation. Disposed above the potting compound 4 is a lens 9 which has been produced from the same hybrid material or comprises the same hybrid material as the potting compound 4.

Preferably, the optoelectronic component 1 is an LED, in which case the primary radiation is emitted upward through a transparent semiconductor layer sequence 2, a transparent potting compound 4 and a transparent lens 9. The secondary radiation is also emitted through the transparent potting compound 4 and the transparent lens 9.

The invention is not restricted by the description of the working examples. Instead, the invention encompasses every new feature and every combination of features, which especially includes every combination of features in the claims, even if this feature or this combination itself is not specified explicitly in the claims or working examples.

The invention claimed is:
1. An optoelectronic component comprising
   a layer sequence having an active layer which emits electromagnetic primary radiation,
   at least one transparent coupling-out element disposed in the beam path of the electromagnetic primary radiation,
   wherein the at least one transparent coupling-out element comprises a hybrid material or has been produced from a hybrid material having the following structure:

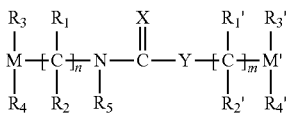

where
   R1, R1', R2, R2' and R5 may be chosen identically or differently and are selected from a group comprising H, saturated and unsaturated alkyl radicals, fully or partly substituted, saturated and unsaturated alkyl radicals, aromatic systems, fully or partly substituted aromatic systems, heterocyclic systems and fully or partly substituted heterocyclic systems,
   R3, R3', R4 and R4' may be chosen identically or differently and are selected from a group comprising H, saturated and unsaturated alkyl radicals, fully or partly substituted, saturated and unsaturated alkyl radicals, alkoxy groups, aryloxy groups, amines, amides, esters, aromatic systems, fully or partly substituted aromatic systems, heterocyclic systems and fully or partly substituted heterocyclic systems,
   X is selected from a group comprising O, S and N—R6,
   R6 is selected from the same group as R1, R1', R2, R2' and R5,
   M and M' may be chosen identically or differently and are selected from a group comprising B, Al, Si—R7, Ge—R7' and Ti—R7",
   Y is selected from a group comprising O, S, N—R5' and a bond,
   R5' is selected from the same group as R1, R1', R2, R2' and R5, and R5' may be selected identically or differently to R1, R1', R2, R2' and R5, R7, R7' and R7" may be chosen identically or differently and are selected from the same group as R3, R3', R4 and R4', and n, m may be chosen identically or differently and $1 \leq n, m \leq 10\,000$.

2. The optoelectronic component according to claim 1, wherein the at least one coupling-out element comprises a hybrid material or has been produced from a hybrid material having the following structure:

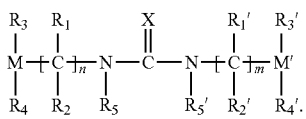

3. The component according to claim 1, wherein the at least one coupling-out element comprises a hybrid material or has been produced from a hybrid material having the following structure:

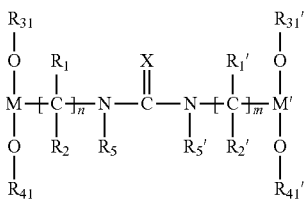

where
R31, R31', R41 and R41' may be chosen identically or differently and are selected from a group comprising H, saturated and unsaturated alkyl radicals, fully or partly substituted, saturated and unsaturated alkyl radicals, aromatic systems, fully or partly substituted aromatic systems, fused aromatic systems, fully or partly substituted, fused aromatic systems, heterocyclic systems, fully or partly substituted heterocyclic systems, fused heterocyclic systems and fully or partly substituted, fused heterocyclic systems, M' is selected from a group comprising B, Al, Si—OR71, Ge—OR71' and Ti—OR71", M is selected from a group comprising B, Al, Si—OR72, Ge—OR72' and Ti—OR72" and R71, R71' and R71" may be chosen identically or differently and are selected from the same group as R31, R31', R41 and R41' and R72, R72' and R72" may be chosen identically or differently and are selected from the same group as R31, R31', R41 and R41'.

4. The component according to claim 1, wherein X=O.

5. The component according to claim 1, wherein the at least one coupling-out element comprises a hybrid material or has been produced from a hybrid material having the following structure:

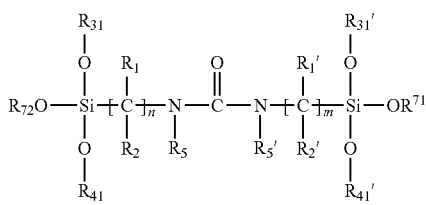

where R31, R31', R41, R41', R71 and R72 may be chosen identically or differently and are selected from a group comprising H, saturated alkyl radicals, fully or partly substituted, saturated alkyl radicals, aromatic systems, fully or partly substituted aromatic systems, heterocyclic systems and fully or partly substituted heterocyclic systems.

6. The component according to claim 1, wherein R1, R1', R2, R2' and R5 or R1, R1', R2, R2', R5 and R5'=H.

7. The component according to claim 1, wherein the at least one coupling-out element comprises nanoparticles.

8. The component according to claim 7, wherein the nanoparticles comprise thermally conductive materials.

9. The component according to claim 7, wherein the nanoparticles comprise fillers having a refractive index $n_D$ at 23° C. of greater than or equal to 2.

10. The component according to claim 9, wherein the fillers are selected from a group comprising $ZrO_2$, $TiO_2$, $Nb_2O_5$, $Ta_2O_5$ and combinations thereof.

11. The component according to claim 1, wherein the at least one coupling-out element comprises converter particles, wherein the converter particles are distributed in the coupling-out element, and wherein the converter particles at least partly convert the electromagnetic primary radiation to an electromagnetic secondary radiation.

12. The component according to claim 11, wherein the converter particles are distributed homogeneously in the coupling-out element.

13. The component according to claim 12, wherein the at least one coupling-out element has been produced from the hybrid material and the converter particles are bound to the hybrid material by chemical bonds.

14. The component according to claim 1, wherein the at least one coupling-out element takes the form of a potting compound, of a lens and/or of a covering plate mounted above the layer sequence.

15. The component according to claim 1, which has a housing having a recess, wherein
the layer sequence together with the active layer is disposed in the recess in the housing and
the housing has been produced from a hybrid material having the following structure:

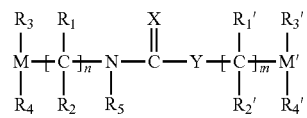

where
R1, R1', R2, R2' and R5 may be chosen identically or differently and are selected from a group comprising H, saturated and unsaturated alkyl radicals, fully or partly substituted, saturated and unsaturated alkyl radicals, aromatic systems, fully or partly substituted aromatic systems, heterocyclic systems and fully or partly substituted heterocyclic systems, R3, R3', R4 and R4' may be chosen identically or differently and are selected from a group comprising H, saturated and unsaturated alkyl radicals, fully or partly substituted, saturated and unsaturated alkyl radicals, alkoxy groups, aryloxy groups, amines, amides, esters, aromatic systems, fully or partly substituted aromatic systems, heterocyclic systems and fully or partly substituted heterocyclic systems, X is selected from a group comprising O, S and N—R6,
R6 is selected from the same group as R1, R1', R2, R2' and R5,
M and M' may be chosen identically or differently and are selected from a group comprising B, Al, Si—R7, Ge—R7' and Ti—R7",
Y is selected from a group comprising O, S, N—R5' and a bond,
R5' is selected from the same group as R1, R1', R2, R2' and R5, and may be selected identically or differently to R1, R1', R2, R2',
R7, R7' and R7" may be chosen identically or differently and are selected from the same group as R3, R3', R4 and R4', and
n, m may be chosen identically or differently and $1 \leq n, m \leq 10\,000$.

16. The component according to claim 15, wherein the housing has been produced from a hybrid material having the following structure

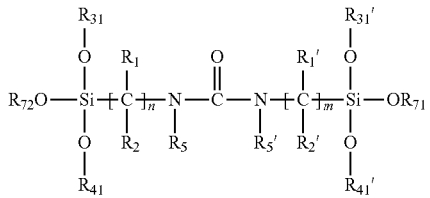

where R31, R31', R41, R41', R71 and R71' may be chosen identically or differently and are selected from a group comprising unsaturated alkyl radicals having terminal C=C double bonds and partly substituted unsaturated alkyl radicals having terminal C=C double bonds.

17. An optoelectronic component comprising
a layer sequence having an active layer which emits electromagnetic primary radiation,
at least one transparent coupling-out element disposed in the beam path of the electromagnetic primary radiation,
wherein the at least one transparent coupling-out element comprises a hybrid material having the following structure:

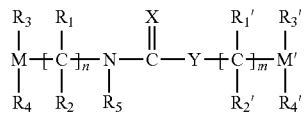

where
R1, R1', R2, R2' and R5 may be chosen identically or differently and are selected from a group comprising H, saturated alkyl radicals, fully or partly substituted, saturated alkyl radicals, aromatic systems, fully or partly substituted aromatic systems, heterocyclic systems and fully or partly substituted heterocyclic systems,
R3, R3', R4 and R4' may be chosen identically or differently and are selected from a group comprising H, saturated alkyl radicals, fully or partly substituted, saturated alkyl radicals, alkoxy groups, aryloxy groups, amines, amides, esters, aromatic systems, fully or partly substituted aromatic systems, heterocyclic systems and fully or partly substituted heterocyclic systems,
X is selected from a group comprising O, S and N—R6,
R6 is selected from the same group as R1, R1', R2, R2' and R5,
M and M' may be chosen identically or differently and are selected from a group comprising B, Al, Si—R7, Ge—R7' and Ti—R7",
Y is selected from a group comprising O, S, N—R5' and a bond,
R5' is selected from the same group as R1, R1', R2, R2' and R5, and R5' may be selected identically or differently to R1, R1', R2, R2' and R5,
R7, R7' and R7" may be chosen identically or differently and are selected from the same group as R3, R3', R4 and R4', and
n, m may be chosen identically or differently and $1 \leq n, m \leq 10\,000$,
wherein the at least one coupling-out element takes the form of a potting compound, of a lens and/or of a covering plate mounted above the layer sequence.

* * * * *